US007589604B2

(12) United States Patent
Ninan et al.

(10) Patent No.: US 7,589,604 B2
(45) Date of Patent: Sep. 15, 2009

(54) SELECTABLE NOTCH FILTER

(75) Inventors: Lukose Ninan, Irvine, CA (US); Stephen E. Krafft, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 234 days.

(21) Appl. No.: 11/607,565

(22) Filed: Dec. 1, 2006

(65) Prior Publication Data

US 2008/0129421 A1 Jun. 5, 2008

(51) Int. Cl.
*H03H 7/01* (2006.01)

(52) U.S. Cl. ...................................... 333/174; 333/176

(58) Field of Classification Search ......... 333/174–176, 333/204, 205

See application file for complete search history.

(56) References Cited

U.S. PATENT DOCUMENTS 5,095,285 A * 3/1992 Khatibzadeh ............... 330/306
6,104,259 A * 8/2000 Miyaura ..................... 333/176
6,625,470 B1 * 9/2003 Fourtet et al. ............ 455/127.4
6,727,786 B2 * 4/2004 Toncich .................. 333/219.2

* cited by examiner

*Primary Examiner*—Benny Lee
*Assistant Examiner*—Gerald Stevens
(74) *Attorney, Agent, or Firm*—Farajami & Farajami LLP

(57) ABSTRACT

According to one exemplary embodiment, a selectable notch filter includes a transmission line, a bias circuit, and a switch for selectably coupling the transmission line to ground. In one embodiment, the switch is a PIN diode. The selectable notch filter can selectably suppress a first frequency from being output when the transmission line is coupled to ground. Additionally, the selectable notch filter can selectably suppress a second frequency from being output when the transmission line is not coupled to ground. In one embodiment, the first frequency is approximately equal to a multiple of two of the second frequency. In one embodiment, the selectable notch filter can utilize more than one transmission line.

7 Claims, 4 Drawing Sheets

SELECTABLE NOTCH FILTER

BACKGROUND OF THE INVENTION

1. Field of the Invention

The present invention is generally in the field of electronic communications circuits and systems. More specifically, the present invention is in the field of communications filters.

2. Background Art

Notch filters are typically used in satellite receiving systems to notch out a specific frequency range. Satellite receiving systems typically utilize a down-converter and a local oscillator to mix a high frequency input signal down to an intermediate frequency ("IF") signal, which is then amplified by a low noise amplifier. Additionally reducing the overall power at the amplifier input by using a notch filter reduces the level of the second and third order intermodulation products produced by the amplifier after the notch filter thereby improving the signal to noise and distortion ratio (SINAD) of the overall satellite receiver system.

Amplification of the low frequencies in a satellite frequency band can produce second harmonic frequencies that interfere with the high frequencies in the same frequency band. These are commonly called second order intermodulation products of the amplifier and are due to nonlinearities of the amplifier which are specified by the IP2 performance of the amplifier. For example, consider a satellite receiving system that is to tune and amplify a satellite frequency band of 950 MHz to 2150 MHz (approximately 1 to 2 GHz). The 950 MHz to 1075 MHz (approximately 1 GHz) band can produce second harmonic frequencies that interfere with the 1900 MHz to 2150 MHz (approximately 2 GHz) band. Thus, tuning and amplification performance within the 1900 MHz to 2150 MHz band can suffer as a result of signal interference from the undesired second harmonics of the 950 MHz to 1075 MHz band.

Conversely, in a direct conversion receiver, the second harmonic frequencies of a local oscillator can mix with the high frequencies of a satellite frequency band to result in lower frequencies that interfere with the low frequencies within that satellite frequency band. For example, consider a satellite receiving system that is to tune and amplify a satellite frequency band of 950 MHz to 2150 MHz. The second harmonic frequency of a local oscillator can mix with the 1900 MHz to 2150 MHz band to result in lower frequencies that interfere with the 950 MHz to 1075 MHz band. Thus, tuning and amplification performance within the 950 MHz to 1075 MHz band can suffer as a result of signal interference from the undesired second harmonics of the local oscillator mixing with the 1900 MHz to 2150 MHz band.

Conventional notch filters to filter out a specific narrow range of frequencies in satellite receiving systems, e.g. either the 1 GHz or the 2 GHz frequency range, have utilized cumbersome inductance-capacitance filters that are expensive and require large amount of circuitry. Moreover, the conventional notch filters do not switch from notching out one range of frequency to another (for example from 1 GHz to 2 GHz and vice versa) with symmetry and effectiveness. There is thus a need in the art for effectively reducing signal interference in a satellite receiving system without the shortcomings of the conventional notch filters.

SUMMARY OF THE INVENTION

A selectable notch filter, substantially as shown in and/or described in connection with at least one of the figures, and as set forth more completely in the claims.

DETAILED DESCRIPTION OF THE INVENTION

The present invention is directed to a selectable notch filter. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 1:
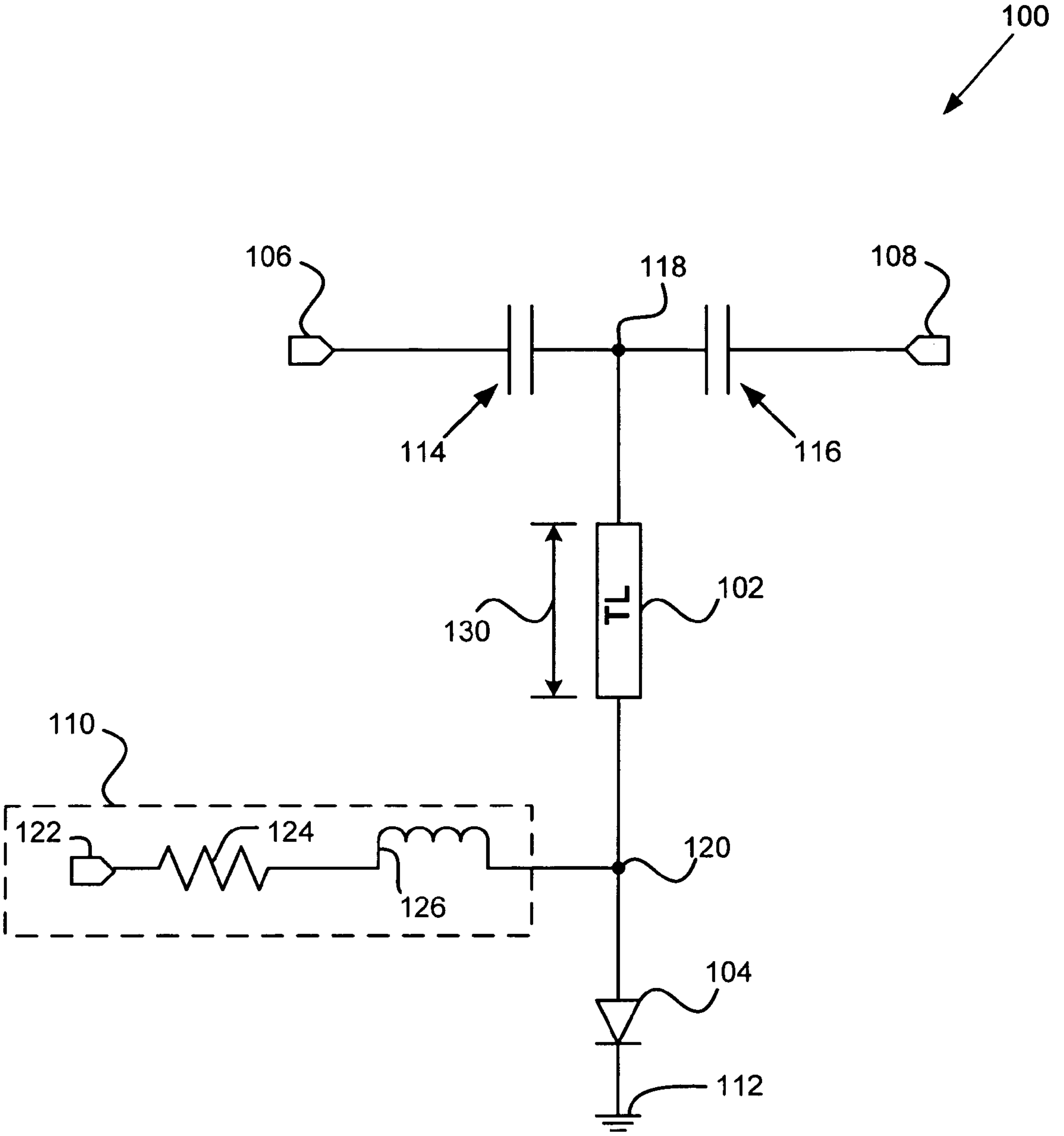
FIG. 1 is a circuit diagram illustrating a notch filter according to one embodiment of the present invention.

FIG. 1 is a circuit diagram of an exemplary notch filter 100 according to one embodiment of the present invention. Notch filter 100 includes transmission line 102, input 106, output 108, bias circuit 110, and capacitors 114 and 116. Transmission line 102 can be a PCB (printed circuit board) microstrip, for example. In the present embodiment, notch filter 100 includes PIN (P type, intrinsic, N type) diode 104, which is an example of a switch that is utilized to selectably couple transmission line 102 to ground 112. In the present embodiment, PIN diode 104 is used as a switch due to its fast switching times and lower capacitance; however, other types of switches, such as a PN (P type, N type) diode, one or more transistors, or other suitable electronic switching devices can also be used in this or other embodiments of the invention. In notch filter 100, input 106 and output 108 are capacitively coupled to transmission line 102 at node 118 by capacitors 114 and 116, respectively. Capacitors 114 and 116 can be utilized within notch filter 100 to, for example, block DC signals. As also shown in FIG. 1, PIN diode 104 and bias circuit 110 are coupled to transmission line 102 at node 120. Bias circuit 1 10 includes input 122, resistor 124, and inductor 126, and can be utilized to forward and reverse bias PIN diode 104 and thus cause PIN diode 104 to selectably couple transmission line 102 to ground 112.

In the embodiment of the invention in FIG. 1, length 130 of transmission line 102 determines the first and second frequencies that can be selectably suppressed by notch filter 100. In the present embodiment, length 130 of transmission line 102 is equal to one half the wavelength of a first frequency, and equal to one quarter of the wavelength of a second frequency, where the first frequency is a multiple of two of the second frequency. For example, to selectably suppress a first frequency of 2 GHz and a second frequency of 1 GHz, length 130 of transmission line 102 should be equal to one half the wavelength of the first frequency (i.e., one half of the wavelength of a 2 GHz signal), which is also equal to one quarter of the wavelength of the second frequency (i.e. one quarter of the wavelength of a 1 GHz signal). In one embodiment, length 130 would be approximately 1.5 inches of a microstrip transmission line on a printed circuit board, which is approximately one half of the wavelength at 2 GHz, and one quarter the wavelength at 1 GHz. In other embodiments, length 130 of transmission line 102 can be equal to odd multiples of one half of the wavelength of the first frequency, such as three half-wavelengths at 2 GHz, which would be equivalent to an odd multiple of one quarter of the wavelength of the second frequency, such as three quarter-wavelengths at 1 GHz.

By selecting length 130 of transmission line 102 to be one half wavelength of the first frequency, at the first frequency the impedances at nodes 118 and 120 of transmission line 102 will be 180 degrees out of phase and equal in magnitude due to a half wavelength transformation. Simply stated, if node 120 is an open circuit at the first frequency, i.e. has a very high impedance to ground, then node 1 18 will also be an open circuit, i.e. will also have a high impedance to ground. Similarly, if node 120 is a short circuit to ground at the first frequency, i.e. has a very low impedance to ground, then node 118 will also be a short circuit to ground, i.e. will have a very low impedance to ground. Notch filter 100 can thus suppress the first frequency by selectably coupling node 120 of transmission line 102 to ground 112.

In the embodiment of FIG. 1, the selectable coupling to ground (and decoupling from ground) can be achieved by applying an appropriate DC voltage to input 122 of bias circuit 110 to forward bias or reverse bias PIN diode 104. This DC voltage can be about 0.7 volts, for example. When PIN diode 104 is forward biased, node 120 of transmission line 102 is coupled to ground 112, which creates a short circuit at node 120. Since at the first frequency, the impedance at node 120 is 180 degrees out of phase, and has the same magnitude as the impedance at node 118, then the half wavelength transformation creates a short circuit to ground at node 118, thus preventing the first frequency from passing to output 108 of notch filter 100.

Conversely, since length 130 of transmission line 102 is one half of the wavelength of the first frequency, which is one quarter wavelength of the second frequency, at the second frequency the impedances at nodes 118 and 120 of transmission line 102 will be 90 degrees out of phase and opposite in magnitude due to a quarter wavelength transformation. Simply stated, if node 120 is an open circuit at the second frequency, i.e. has a very high impedance to ground, then node 118 will be a short circuit to ground, i.e. will have a very low impedance to ground. Similarly, if node 120 is a short circuit to ground at the second frequency, i.e. has a very low impedance to ground, then node 118 will be an open circuit, i.e. will have a very high impedance to ground. Notch filter 100 can thus suppress the second frequency when node 120 of transmission line 102 is an open circuit, i.e. when node 120 is decoupled from ground 112.

As stated above, in the embodiment of FIG. 1, the selectable coupling to ground (and decoupling from ground) can be achieved by applying an appropriate DC voltage to input 122 of bias circuit 110 to forward bias or reverse bias PIN diode 104. This DC voltage can be about 0.7 volts, for example. When PIN diode 104 is reverse biased, node 120 of transmission line 102 is decoupled from ground 112, which creates an open circuit at node 120. Since at the second frequency, the impedance at node 120 is 90 degrees out of phase, and has a magnitude opposite to the impedance at node 118, then the quarter wavelength transformation creates a short circuit to ground at node 118, thus preventing the second frequency from passing to output 108 of notch filter 100.

Figure 2:
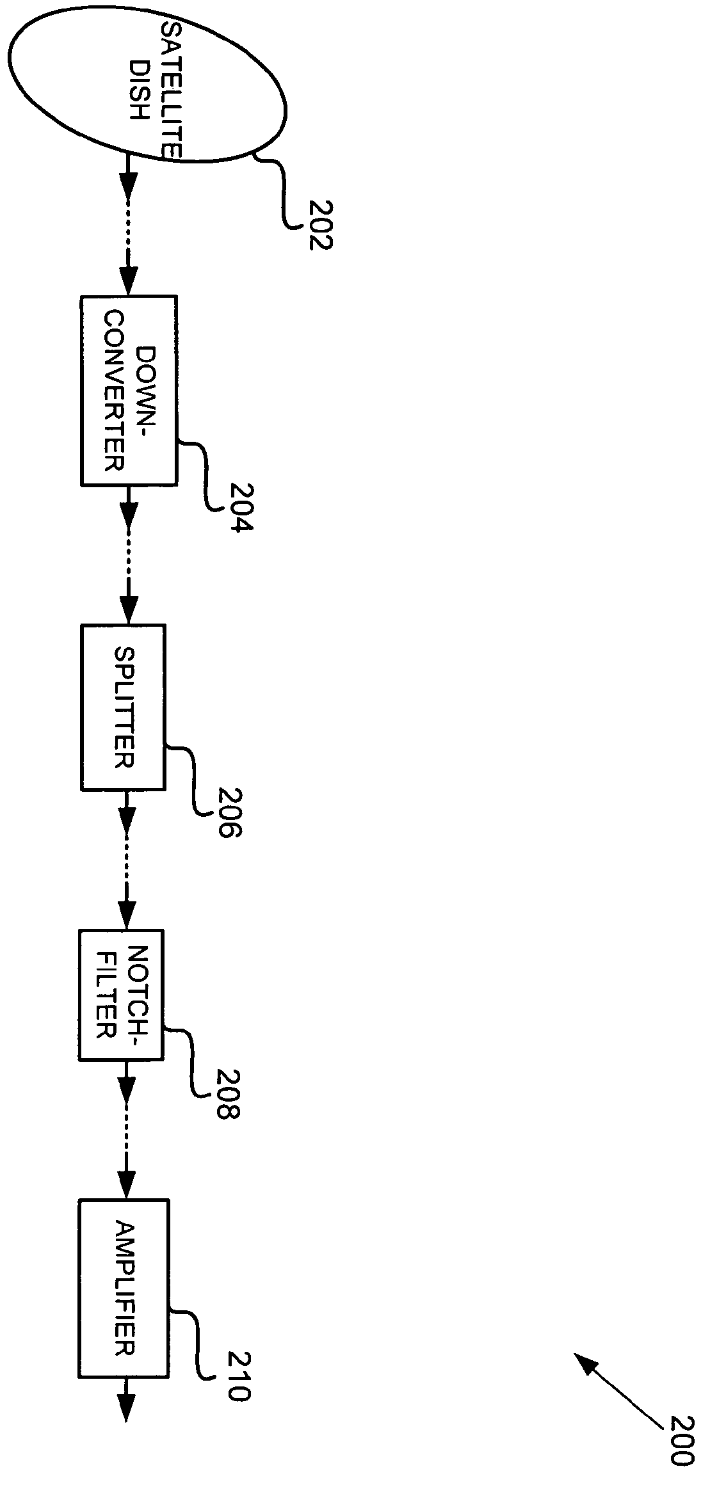
FIG. 2 illustrates a diagram of an exemplary system utilizing an embodiment of the invention's notch filters.

FIG. 2 illustrates a diagram of exemplary electronic system 200 utilizing an embodiment of the invention's notch filter, for example notch filter 100 described above. Electronic system 200 can be a satellite receiving system, for example. Electronic system 200 includes satellite dish 202, down-converter 204, splitter 206, notch filter 208, and amplifier 210. Notch filter 208 of system 200 can be, for example, notch filter 100 of FIG. 1, as described above. Electronic system 200 may contain additional electronic components not shown in FIG. 2 or described herein.

Satellite dish 202 typically receives relatively high radio frequencies. Down-converter 204 converts the signals received by satellite dish 202 to much lower, or intermediate frequencies. Down-converter 204 can include a low noise amplifier ("LNA") and a low noise block ("LNB") down-converter, for example. Down-converter 204 can be connected to splitter 206. Notch filter 208 is connected between splitter 206 and amplifier 210. As described above in reference to FIG. 1, notch filter 208 can selectably suppress first and second frequencies from passing through. Since notch filter 208 can filter out selected unwanted frequencies before the signals reaches amplifier 210, amplifier 210 can be a higher gain amplifier than would be possible without notch filter 208, which advantageously increases the sensitivity and performance of electronic system 200.

Figure 3:
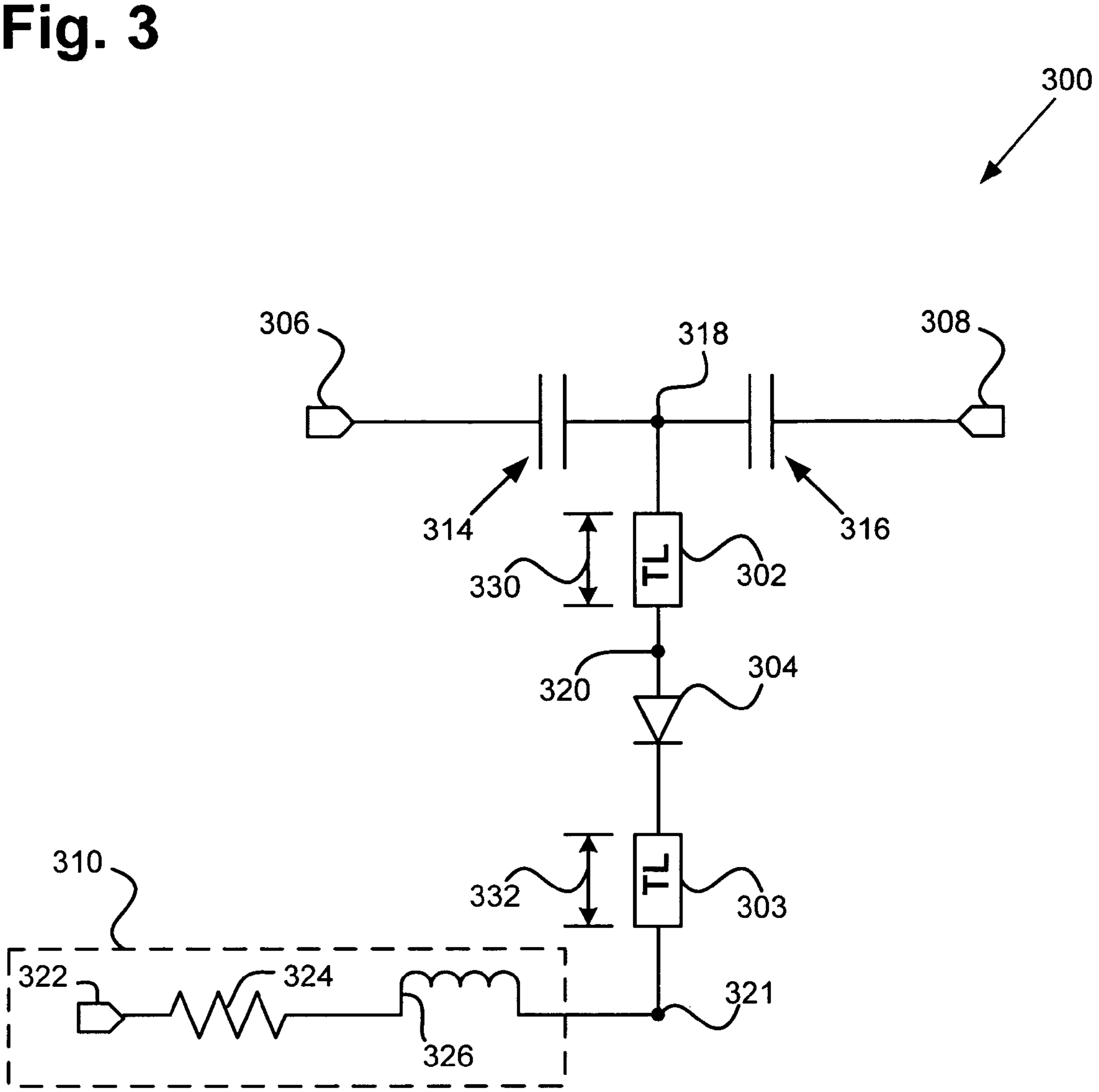
FIG. 3 is a circuit diagram illustrating a notch filter according to one alternative embodiment of the present invention.

FIG. 3 is a circuit diagram of an exemplary notch filter 300 according to one embodiment of the present invention. In notch filter 300, input 306, output 308, bias circuit 310, and capacitors 314 and 316 correspond, respectively, to input 106, output 108, bias circuit 110, and capacitors 114 and 116 in FIG. 1. In the present embodiment, notch filter 300 includes transmission lines 302 and 303 of lengths 330 and 332, respectively. Transmission lines 302 and 303 can be PCB (printed circuit board) microstrips, for example. Notch filter 300 also includes PIN (P type, intrinsic, N type) diode 304, which is an example of a switch that is utilized to selectably couple transmission line 302 to transmission line 303. PIN diode 304 is used as a switch due to its fast switching times and lower capacitance; however, other types of switches, such as a PN (P type, N type) diode, one or more transistors, or other suitable electronic switching devices can also be used in this or other embodiments of the invention.

In notch filter 300, input 306 and output 308 are capacitively coupled to transmission line 302 at node 318 by capacitors 314 and 316, respectively. Capacitors 314 and 316 can be utilized within notch filter 300 to, for example, block DC signals. As also shown in FIG. 3, bias circuit 310 is coupled to transmission line 303 at node 321. Bias circuit 310 includes input 322, resistor 324, and inductor 326, and can be utilized as an aid to forward and reverse bias PIN diode 304 and thus cause PIN diode 304 to selectably couple transmission line 302 to transmission line 303. Thus, although in the present embodiment node 321 is always an AC open circuit, the DC voltage at node 321 can be controlled by bias circuit 310 to appropriately bias PIN diode 304.

In the embodiment of the invention in FIG. 3, lengths 330 and 332 of transmission lines 302 and 303, respectively, determine the first and second frequencies that can be selectably suppressed by notch filter 300. In the present embodiment, each length 330 and 332 of each transmission line 302 and 303 is equal to one quarter of the wavelength of a first frequency, and each length is equal to one eighth of the wavelength of a second frequency, where the first frequency is a multiple of two of the second frequency. For example, to selectably suppress a first frequency of 2 GHz and a second frequency of 1 GHz, each length 330 and 332 of each transmission line 302 and 303 should be equal to one quarter of the wavelength of the first frequency (i.e., one quarter of the wavelength of a 2 GHz signal), which is also equal to one eighth of the wavelength of the second frequency (i.e. one eighth of the wavelength of a 1 GHz signal).

Since length 330 of transmission line 302 is equal to one quarter of the wavelength of the first frequency, at the first frequency the impedances at nodes 318 and 320 of transmission line 302 will be 90 degrees out of phase and opposite in magnitude due to a quarter wavelength transformation. Simply stated, if node 320 is an open circuit at the first frequency, i.e. has a very high impedance to ground, then node 318 will be a short circuit, i.e. will have a very low impedance to ground. Notch filter 300 can thus suppress the first frequency by selectably reverse biasing PIN diode 304, thus causing an open circuit at node 320. PIN diode 304 can be reverse biased by, for example, applying appropriate DC voltages at nodes 320 and 321, with the aid of bias circuit 310. For example, when length 330 of transmission line 302 is one quarter of the wavelength at 2 GHz, and when PIN diode 304 is reverse biased, notch filter 300 will suppress signals at 2 GHz frequency, preventing them from passing through while allowing signals at 1 GHz frequency to pass through.

Conversely, since each length 330 and 332 of each transmission line 302 and 303 is equal to one eighth of the wavelength at the second frequency, when PIN diode 304 is forward biased, the sum of the lengths 330 and 332 of transmission lines 302 and 303 will be equal to one quarter of the wavelength at the second frequency. Thus, the impedances at nodes 318 and 321 will be 90 degrees out of phase and opposite in magnitude due to a quarter wavelength transformation. Simply stated, if node 321 is an open circuit at the second frequency, i.e. has a very high impedance to ground, then node 318 will be a short circuit, i.e. will have a very low impedance to ground. Notch filter 300 can thus suppress the second frequency by selectably forward biasing PIN diode 304. PIN diode 304 can be forward biased by, for example, applying appropriate DC voltages at nodes 320 and 321, with the aid of bias circuit 310. By way of a specific example, when each length 330 and 332 of each transmission line 302 and 303 is one quarter of the wavelength at 2 GHz, and thus one eighth of the wave length at 1 GHz, and when PIN diode 304 is forward biased, notch filter 300 will suppress signals at 1 GHz frequency due to the quarter wavelength transformation at 1 GHz, while allowing signals at 2 GHz frequency to pass through.

Figure 4:
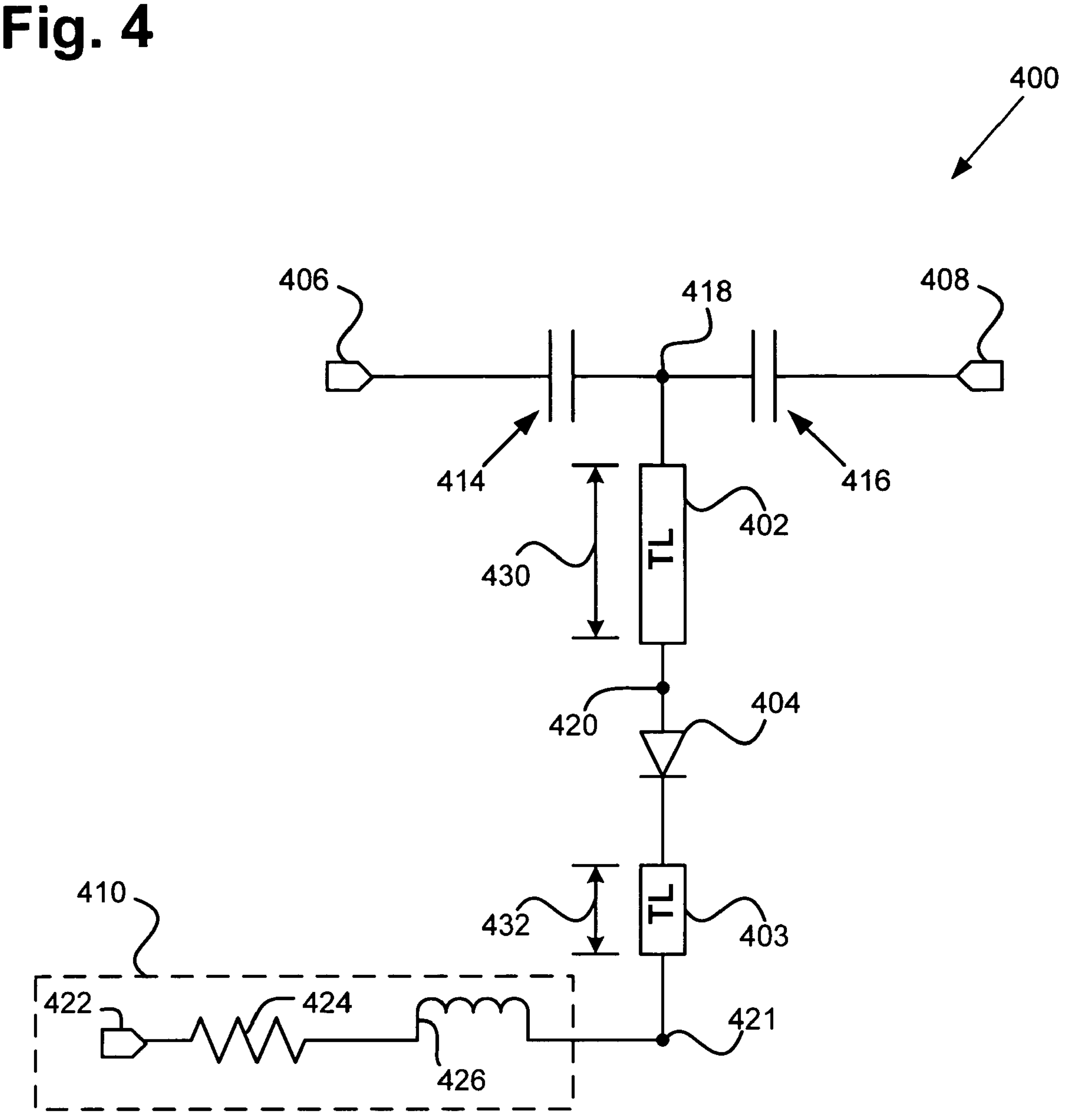
FIG. 4 is a circuit diagram illustrating a notch filter according to another alternative embodiment of the present invention.

FIG. 4 is a circuit diagram of an exemplary notch filter 400 according to another embodiment of the invention. In notch filter 400, input 406, output 408, bias circuit 410, and capacitors 414 and 416 correspond, respectively, to input 106, output 108, bias circuit 110, and capacitors 114 and 116 in FIG. 1. In the present embodiment, notch filter 400 includes transmission lines 402 and 403 of lengths 430 and 432, respectively. Transmission lines 402 and 403 can be PCB (printed circuit board) microstrips, for example. Notch filter 400 also includes PIN (P type, intrinsic, N type) diode 404, which is an example of a switch that is utilized to selectably couple transmission line 402 to transmission line 403. PIN diode 404 is used as a switch due to its fast switching times and lower capacitance; however, other types of switches, such as a PN (P type, N type) diode, one or more transistors, or other suitable electronic switching devices can also be used in this or other embodiments of the invention.

In notch filter 400, input 406 and output 408 are capacitively coupled to transmission line 402 at node 418 by capacitors 414 and 416, respectively. Capacitors 414 and 416 can be utilized within notch filter 400 to, for example, block DC signals. As also shown in FIG. 4, bias circuit 410 is coupled to transmission line 403 at node 421. Bias circuit 410 includes input 422, resistor 424, and inductor 426, and can be utilized as an aid to forward and reverse bias PIN diode 404 and thus cause PIN diode 404 to selectably couple transmission line 402 to transmission line 403. Thus, although in the present embodiment node 421 is always an AC open circuit, the DC voltage at node 421 can be controlled by bias circuit 410 to appropriately bias PIN diode 404.

In the embodiment of the invention in FIG. 4, lengths 430 and 432 of transmission lines 402 and 403, respectively, determine the first and second frequencies that can be selectably suppressed by notch filter 400. In the present embodiment, length 430 of transmission line 402 is equal to one half of the wavelength of a first frequency, which is equal to one quarter of the wavelength of a second frequency, while length 432 of transmission line 403 is equal to one quarter of the wavelength of the first frequency, which is equal to one eighth of the wavelength of the second frequency. As with the other embodiments discussed above, the first frequency is a multiple of two of the second frequency. For example, the first frequency can be 2 GHz while the second frequency can be 1 GHz.

Since length 430 of transmission line 402 is equal to one quarter of the wavelength of the second frequency, at the second frequency the impedances at nodes 418 and 420 of transmission line 402 will be 90 degrees out of phase and opposite in magnitude due to a quarter wavelength transformation. Simply stated, if node 420 is an open circuit at the second frequency, i.e. has a very high impedance to ground, then node 418 will be a short circuit, i.e. will have a very low impedance to ground. Notch filter 400 can thus suppress the second frequency by selectably reverse biasing PIN diode 404, thus causing an open circuit at node 420. PIN diode 404 can be reverse biased by, for example, applying appropriate DC voltages at nodes 420 and 421, with the aid of bias circuit 410. For example, when length 430 of transmission line 402 is one quarter of the wavelength at 1 GHz, and when PIN diode 404 is reverse biased, notch filter 400 will suppress signals at 1 GHz frequency, preventing them from passing through while allowing signals at 2 GHz frequency to pass through.

Conversely, when PIN diode 404 is forward biased, the sum of the lengths 430 and 432 of transmission lines 402 and 403 will be equal to three quarters of the wavelength at the first frequency. That is, at the first frequency, the half wavelength transmission line 402 and the quarter wavelength transmission line 403 will make a total of three quarters of the first frequency wavelength when PIN diode 404 is forward biased. Thus, the impedances at nodes 418 and 421 will be 90 degrees out of phase and opposite in magnitude due to the three-quarter wavelength transformation. Simply stated, if node 421 is an open circuit at the first frequency, i.e. has a very high impedance to ground, then node 418 will be a short circuit, i.e. will have a very low impedance to ground. Notch filter 400 can thus suppress the first frequency by selectably forward biasing PIN diode 404. PIN diode 404 can be forward biased by, for example, applying appropriate DC voltages at nodes 420 and 421, with the aid of bias circuit 410. For example, when length 430 of transmission line 402 is one half of the wavelength at 2 GHz and length of transmission line 403 is one quarter of the wavelength at 2 GHz, and when PIN diode 404 is forward biased, notch filter 400 will suppress signals at 2 GHz frequency, preventing them from passing through while allowing signals at 1 GHz frequency to pass through.

Thus, various embodiments of the present invention, some of which were specifically described above, result in a significantly improved notch filter to filter out a specific narrow range of frequencies, e.g. either the 1 GHz or the 2 GHz frequency range, without some of the disadvantages of conventional notch filters. For example, the various embodiments of the invention are cost effective and require a relatively small amount of circuitry to implement. Moreover, unlike the conventional notch filters, the embodiments of the invention's notch filter switch from notching out one range of frequency to another (for example from 1 GHz to 2 GHz and vice versa) with symmetry and effectiveness. The invention's notch filters can thus be effectively utilized to, for example, reduce signal interference in satellite receiving systems and other electronic systems without some of the shortcomings of the conventional notch filters.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus a selectable notch filter has been described.

The invention claimed is:

1. A filter for selectably suppressing first and second frequencies, wherein said first frequency is a multiple of said second frequency, said filter comprising:

a first transmission line;

a switch for selectably coupling said transmission line to second transmission line;

said filter suppressing said first frequency when said first transmission line is coupled to said second transmission line, and suppressing said second frequency when said transmission line is not coupled to said second transmission line.

2. The filter of claim 1 wherein said first transmission and second transmission lines has a length approximately equal to one quarter of a wavelength of said first frequency.

3. The filter of claim 1 wherein said first transmission line has a length approximately equal to one half of a wavelength of said first frequency, and wherein said second transmission line has a length approximately equal to one quarter of a wavelength of said first frequency.

4. The filter of claim 1 wherein said switch is a PIN diode.

5. The filter of claim 1 wherein said first frequency is approximately equal to a multiple of two of said second frequency.

6. The filter of claim 1 wherein each of said first and second transmission lines is a PCB microstrip.

7. A satellite receiving system including the filter of claim 1.

* * * * *